(12) United States Patent
Buot et al.

(10) Patent No.: US 12,740,420 B2
(45) Date of Patent: Sep. 15, 2026

(54) STRUCTURE FOR DELAMINATION MITIGATION IN A SEMICONDUCTOR DEVICE

(71) Applicant: QUALCOMM Incorporated, San Diego, CA (US)

(72) Inventors: Joan Rey Villarba Buot, Escondido, CA (US); Zhijie Wang, San Diego, CA (US); Hong Bok We, San Diego, CA (US); Sang-Jae Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 473 days.

(21) Appl. No.: 18/450,943

(22) Filed: Aug. 16, 2023

(65) Prior Publication Data

US 2025/0062246 A1 Feb. 20, 2025

(51) Int. Cl.
*H10W 42/00* (2026.01)
*H10W 90/00* (2026.01)

(52) U.S. Cl.
CPC ....... *H10W 42/121* (2026.01); *H10W 90/701* (2026.01); *H10W 90/724* (2026.01)

(58) Field of Classification Search
CPC .......................... H01L 23/562; H10W 42/121
See application file for complete search history.

(56) References Cited

U.S. PATENT DOCUMENTS

2005/0023704 A1* 2/2005 Lin ........................ H05K 1/111 257/E23.079
2018/0130774 A1 5/2018 Lin et al.
2019/0279937 A1 9/2019 Chiu et al.
2019/0304862 A1 10/2019 Lu

OTHER PUBLICATIONS

International Search Report and Written Opinion—PCT/US2024/040147—ISA/EPO—Feb. 14, 2025.

* cited by examiner

*Primary Examiner* — William A Harriston
(74) *Attorney, Agent, or Firm* — Muncy, Geissler, Olds & Lowe, P.C.

(57) ABSTRACT

Disclosed are devices in which a die, such as a system-on-chip (SoC) die is attached to an interposer with a mold. Unlike convention devices, the contact area for adhesion is increased by providing vertical surfaces in addition to lateral surfaces for attachment. In so doing, possibility of delamination is decreased significantly.

22 Claims, 8 Drawing Sheets

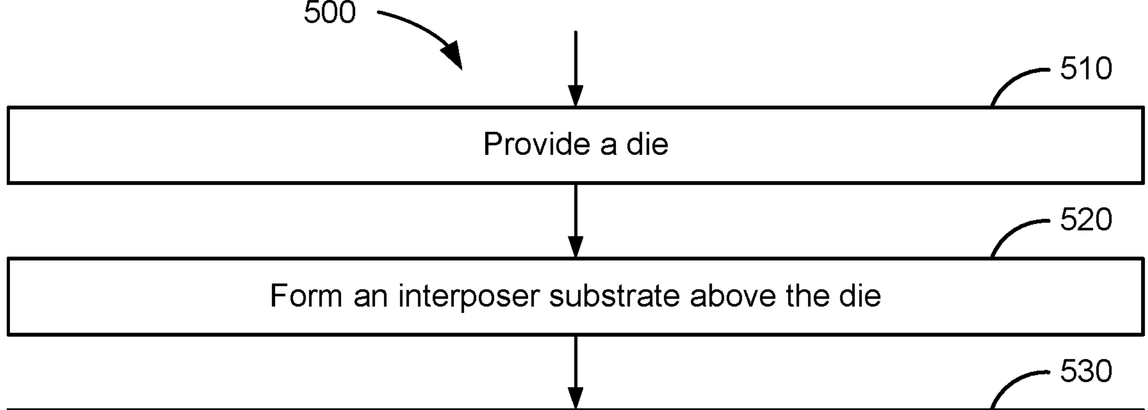

530

Form a mold in between the die and the interposer substrate, the mold encapsulating upper and side surfaces of the die, wherein the interposer substrate comprises: a first interposer solder resist (SR); a first interposer metal plane on the first interposer SR; a laminate core on the first interposer metal plane; a second interposer metal plane on the laminate core; a second first interposer SR on the second interposer metal plane; and one or more interposer vias formed in the laminate core, the one or more interposer vias configured to electrically couple the first and second metal planes; wherein the device further comprises one or more adhesion holes configured to expose side surfaces of one or more SR posts and one or more post landings, the one or more SR posts being portions of the first interposer SR and the one or more post landings being portions of the first interposer metal plane, the one or more SR posts being formed on and in contact with corresponding one or more post landings, and wherein the mold fills the one or more adhesion holes such that the mold is in contact with the exposed side surfaces of one or more SR posts and of the one or more post landings

*FIG. 5*

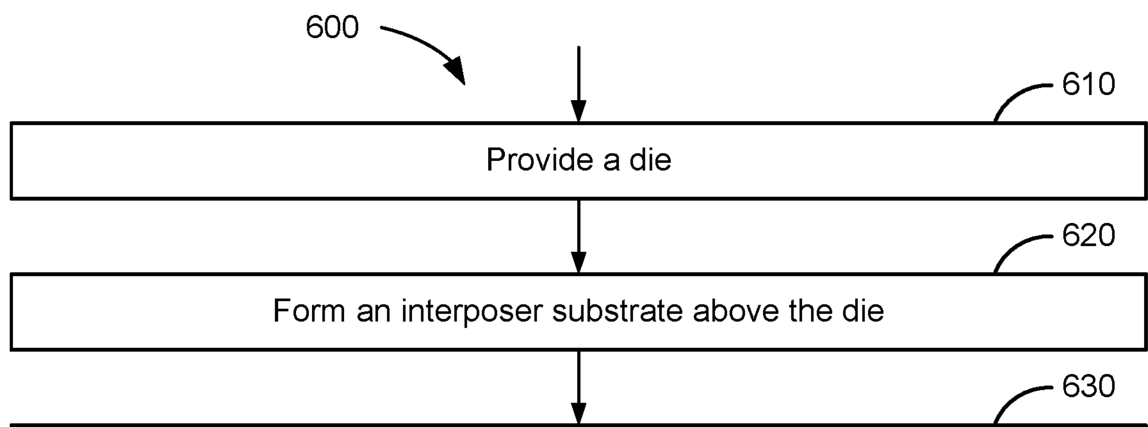

Form a mold in between the die and the interposer substrate, the mold encapsulating upper and side surfaces of the die, wherein the interposer substrate comprises: a first interposer solder resist (SR); a first interposer metal plane on the first interposer SR; a laminate core on the first interposer metal plane; a second interposer metal plane on the laminate core; a second first interposer SR on the second interposer metal plane; and one or more interposer vias formed in the laminate core, the one or more interposer vias configured to electrically couple the first and second metal planes; wherein the device further comprises one or more adhesion holes configured to expose side surfaces of one or more SR posts and one or more post landings, the one or more SR posts being portions of the first interposer SR and the one or more post landings being portions of the first interposer metal plane, the one or more SR posts being formed on and in contact with corresponding one or more post landings, and wherein the mold fills the one or more adhesion holes such that the mold is in contact with the exposed side surfaces of one or more SR posts and of the one or more post landings

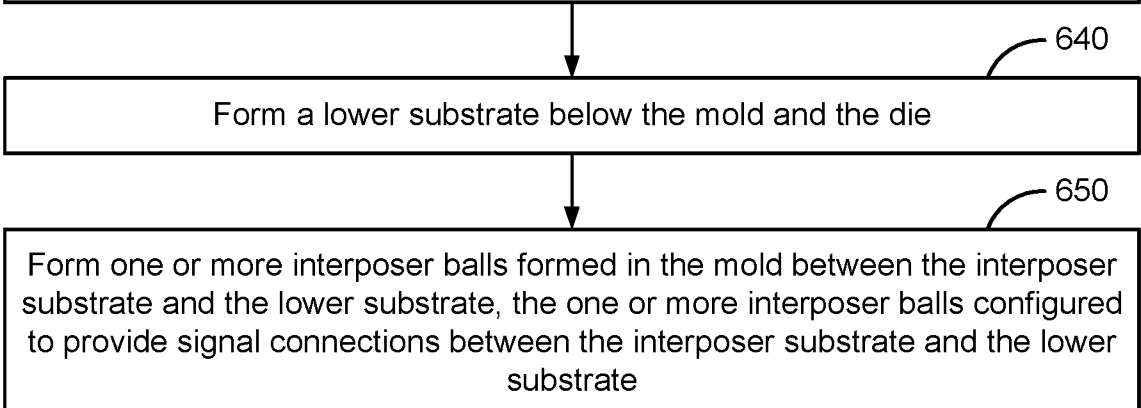

*FIG. 6*

STRUCTURE FOR DELAMINATION MITIGATION IN A SEMICONDUCTOR DEVICE

FIELD OF DISCLOSURE

This disclosure relates generally to semiconductor devices, and more specifically, but not exclusively, to a structure to mitigate delamination in devices (e.g., package-on-package devices), and fabrication techniques thereof.

BACKGROUND

Integrated circuit (IC) technology has achieved great strides in advancing computing power through miniaturization of active components. Such active components are available in many electronic devices such as mobile devices. Premium tier mobile devices use package-on-package (POP) structure. Unfortunately, such structures encounter poor adhesion between silicon die, mold and substrate interposer causing delamination fails, such as during surface mount technology (SMT) attach in board. Delamination typically occurs on weak interfaces such as between mold and interposer solder resist (SR) surface.

Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary device is disclosed. The device may comprise a die. The device may also comprise an interposer above the die. The device may further comprise a mold in between the die and the interposer, the mold encapsulating upper and side surfaces of the die. The interposer may comprise a first interposer solder resist (SR), a first interposer metal plane on the first interposer SR, a laminate core on the first interposer metal plane, a second interposer metal plane on the laminate core, a second first interposer SR on the second interposer metal plane, and one or more interposer vias formed in the laminate core, the one or more interposer vias electrically coupling the first and second interposer metal planes. The device may yet comprise one or more adhesion holes exposing side surfaces of one or more SR posts and one or more post landings. The one or more SR posts may be portions of the first interposer SR and the one or more post landings may be portions of the first interposer metal plane. The one or more SR posts may be formed on and in contact with corresponding one or more post landings. The mold may fill the one or more adhesion holes such that the mold is in contact with the exposed side surfaces of one or more SR posts and of the one or more post landings.

A method of fabricating a device is disclosed. The method may comprise providing a die. The method may also comprise forming an interposer above the die. The method may further comprise forming a mold in between the die and the interposer, the mold encapsulating upper and side surfaces of the die. The interposer may comprise a first interposer solder resist (SR), a first interposer metal plane on the first interposer SR, a laminate core on the first interposer metal plane, a second interposer metal plane on the laminate core, a second first interposer SR on the second interposer metal plane, and one or more interposer vias formed in the laminate core, the one or more interposer vias electrically coupling the first and second interposer metal planes. The device may yet comprise one or more adhesion holes exposing side surfaces of one or more SR posts and one or more post landings. The one or more SR posts may be portions of the first interposer SR and the one or more post landings may be portions of the first interposer metal plane. The one or more SR posts may be formed on and in contact with corresponding one or more post landings. The mold may fill the one or more adhesion holes such that the mold is in contact with the exposed side surfaces of one or more SR posts and of the one or more post landings.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 5-7 illustrate flow charts of example methods of fabricating a device in accordance with one or more aspects of the disclosure.

Figure 1:
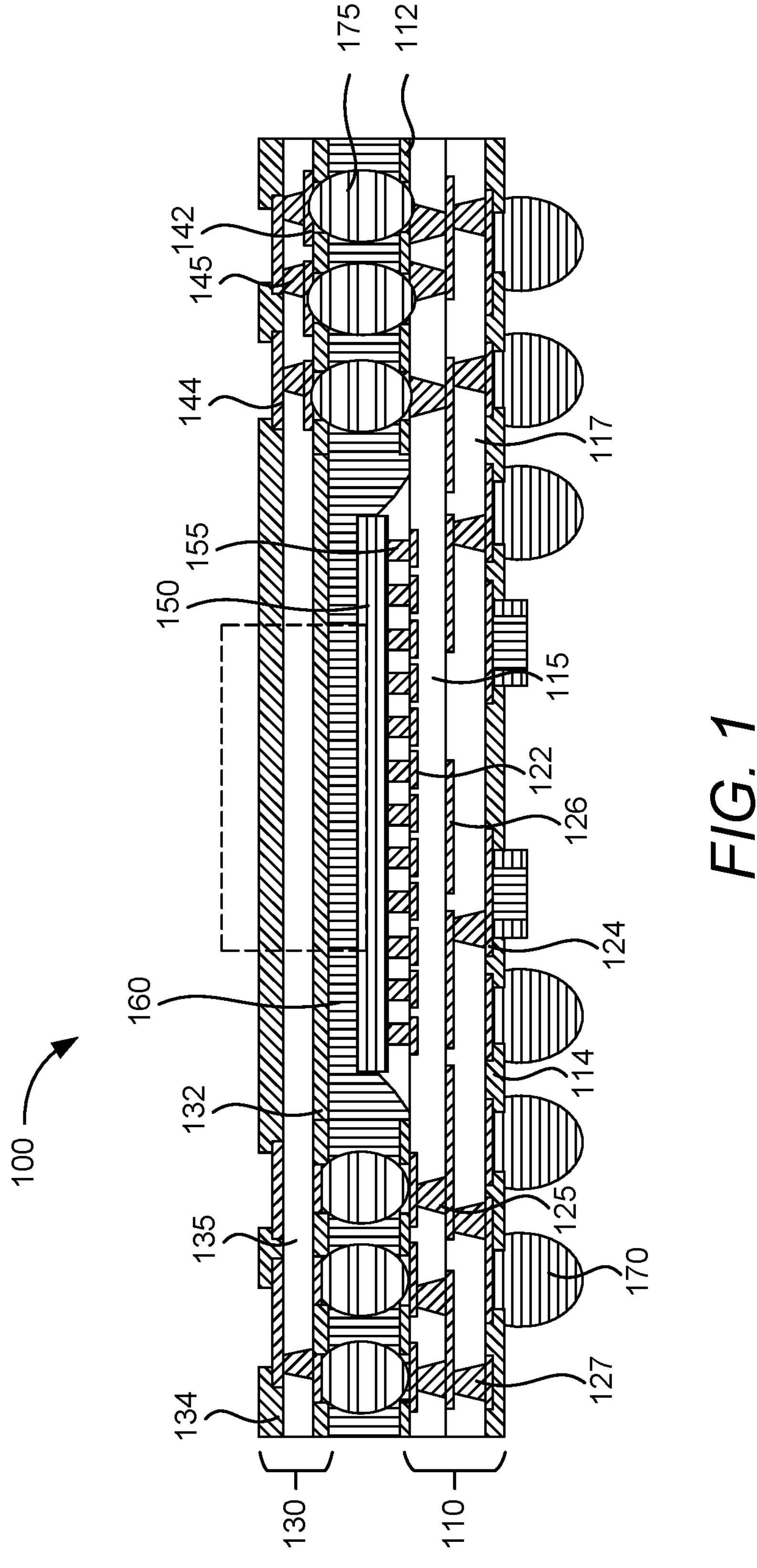
FIG. 1 illustrates a cross section of a conventional package-on-package (POP) device.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising." "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, a cell may be viewed as a circuitry that provides a logic function such as AND, NOT, OR, etc. Gate-tie-down (GTD) enables an electrical diffusion break and avoids the need for physical diffusion break. Conventional GTD schemes normally implement frontside power designs, where the metal wires are on the front face of the wafer.

FIG. 1 illustrates a cross section of a conventional package-on-package (POP) device. As seen, the conventional POP device 100 includes a lower substrate 110, an interposer 130, and a die 150 therebetween. A mold 160, which is also in between the lower substrate 110 and the interposer 130, encapsulates the side and upper surfaces of the die 150.

The lower substrate 110 includes two layers of solder resist (SR) (first and second lower SRs 112, 114), three layers of copper (first, second, and intermediate lower copper planes 122, 124, 126), two layers of dielectrics (first and second lower dielectrics 115, 117), and two sets of vias (first and second lower vias 125, 127). The first and second lower SRs 112, 114 respectively represent uppermost and lowermost layers of the lower substrate 110. The first lower copper plane 122 is immediately below the first lower SR 112, the second lower copper plane 124 is immediately above the second lower SR 114, and the intermediate lower copper plane 116 is therebetween. The first lower dielectric 115 fills the space in between the first and intermediate lower copper planes 122, 126, and the second lower dielectric 117 fills the space in between the intermediate and second lower copper planes 126, 124. The first and second lower vias 125, 127 are formed in the first and second lower dielectrics 115, 117, respectively. The first and second lower copper planes 122, 124 are electrically coupled to each other through the first lower vias 125, the intermediate lower copper plane 126, and the second lower vias 127.

The interposer 130 also includes two layers of solder resist (SR) (first and second interposer SRs 132, 134), two layers of copper (first and second interposer copper planes 142, 144), a copper clad laminate (CCL) 135, and interposer vias 145. The first and second interposer SRs 132, 134 respectively represent lowermost and uppermost layers of the interposer 130. The first interposer copper plane 142 is immediately above the first interposer SR 132, and the second intermediate copper plane 144 is immediately below the second interposer SR 134. The CCL 135 fills the space in between the first and second interposer copper planes 142, 144. The interposer vias 145 are formed in the CCL 135, respectively. The first and second interposer copper planes 142, 144 are electrically coupled to each other through the interposer vias 145.

Interposer balls 175 are formed in the mold 160 in between the interposer 130 and the lower substrate 110 and are in electrical contact with the first interposer copper plane 142 and the first lower copper plane 122. BGA balls 170 are formed on and below the lower substrate 110 and are in electrical contact with the second lower copper plane 122. The die 150 comprises die bumps 155 that are in contact with first lower copper plane 122. In this way, the die 150 can be electrically coupled to the BGA balls 170.

As indicated above, conventional POP structures can suffer from delamination due to poor adhesion between silicon die, mold and substrate interposer. Delamination typically occurs on weak interfaces such as between mold and interposer SR surface. In FIG. 1, the dashed box indicates such a weak interface. Note that contact area between the mold 160 and the interposer 130 is purely lateral (e.g., X-Y surface area) between the mold 160 and the first interposer SR 132.

In an aspect, it is proposed to increase the contact area for adhesion between the mold and the interposer by adding a vertical (e.g., Z) contact area component. Note that delamination is caused by stress, which can be quantified as amount of force F per unit area A (e.g., F/A). By increasing the area A, the amount of stress can be reduced, and thus, reduce the likelihood of delamination from occurring.

Figure 2:
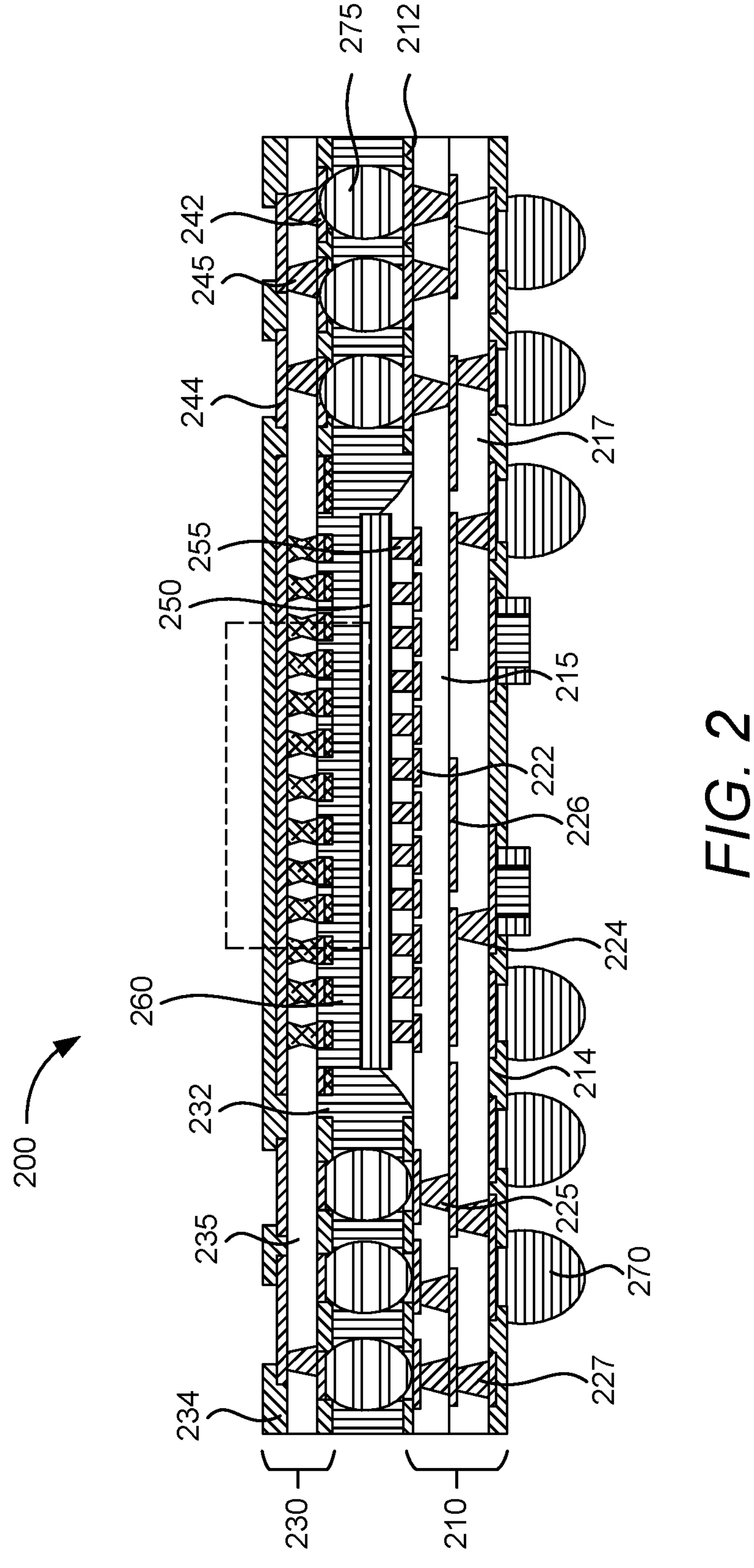
FIG. 2 illustrates a cross section of a device in accordance with one or more aspects of the disclosure.

FIG. 2 illustrates a cross section of a device 200 in accordance with one or more aspects of the disclosure. In an aspect, the device 200 may be a package-on-package (POP) device. The device 200 may include a lower substrate 210, an interposer 230, and a die 250 therebetween. A mold 260 may also be in between the lower substrate 210 and the interposer 230. The mold 260 may encapsulate the upper surface of the die 250. The mold 260 may also encapsulate the side surfaces (at least partially) of the die 250.

The lower substrate 210 may include a plurality of solder resist (SR) layers, a plurality of metal layers, one or more dielectric layers, and one or more sets of lower vias. In the example of FIG. 2, the lower substrate 210 is shown as including two layers of SRs-first and second lower SRs 212, 214, which may respectively represent uppermost and lowermost layers of the lower substrate 210.

The lower substrate 210 is shown as including three metal layers-first, second, and intermediate lower metal planes 222, 224, 226. These metal planes, which may be formed from metals such as copper (Cu), may be etched to function as redistribution layers (RDLs) to distribute signals, power, and ground as appropriate. The first lower metal plane 222 may be immediately below the first lower SR 212, the second lower metal plane 224 may be immediately above the second lower SR 214, and the intermediate lower metal plane 216 may be between first and second lower metal planes 222, 224.

While FIG. 2 illustrates one intermediate lower metal plane 216, this is merely an example. In general, there can be any number of intermediate lower metal planes including zero. That is, there can be M number of intermediate lower metal planes, where M≥0.

The lower substrate 210 is also shown as including two layers of dielectrics-first and second lower dielectrics 215, 217. The first lower dielectric 215 may fill the space between the first and intermediate lower metal planes 222, 226, and the second lower dielectric 217 may fill the space in between the intermediate and second lower metal planes 226, 224.

While FIG. 2 illustrates two dielectric layers, this merely an example. In general, there can be N dielectric layers, where N≥1. Each dielectric layer can fill the space between adjacent lower metal planes.

The lower substrate 210 is further shown as including two sets of one or more lower vias—first and second lower vias 225, 227. The one or more first lower vias 225 may be formed in the first lower dielectric 215, and the one or more second lower vias 227 may be formed in the second lower dielectric 217. The first lower vias 225 may electrically couple the first and intermediate lower metal planes 222, 226, and the second lower vias 227 may electrically couple the intermediate and the second lower metal planes 226, 224. As such, the first and second lower metal planes 222, 224 may be electrically coupled through the first lower vias 225, the intermediate lower metal plane 226, and the second lower vias 227.

While FIG. 2 illustrates two sets of lower vias, this is merely an example. In general, there can be N sets of lower vias (same as the number of dielectrics), in which each set may comprise one or more lower vias. Each set of one or more lower vias may be formed in the corresponding dielectric layer, and may electrically connect the adjacent lower metal planes. As such, the first and second lower metal planes 222, 224 may be electrically coupled through the N sets of lower vias and the M intermediate lower metal planes.

The interposer 230 may also include a plurality of SR layers, a plurality of metal layers, one or more laminate cores, and one or more sets of interposer vias. In the example of FIG. 2, the interposer 230 is shown as including two layers of SRs—first and second interposer SRs 232, 234, which may respectively represent lowermost and uppermost layers of the interposer 230.

The interposer 230 is shown as including two metal layers—first and second interposer metal planes 242, 244. These metal planes, which may be formed from metals such as copper (Cu), may be etched to function as redistribution layers (RDLs) to distribute signals, power, and ground as appropriate. The first interposer metal plane 242 may be immediately above the first interposer SR 232, and the second interposer metal plane 244 may be immediately below the second interposer SR 234.

While not shown, it should be noted that there can also be some number of intermediate interposer metal planes between the first and second interposer metal planes 242, 244. That is, there can be J number of intermediate lower metal planes, where J≥0.

The interposer 230 is also shown as including a single laminate core 335. In an aspect, the laminate core 335 may be a copper clad layer (CCL). The laminate core 335 may fill the space between the first and second interposer metal planes 242, 244.

While FIG. 2 illustrates a single laminate core, this merely an example. In general, there can be K laminate cores, where K≥1. Each laminate core can fill the space between adjacent interposer metal planes.

The interposer 230 is further shown as including a set of one or more interposer vias 245. The one or more first interposer vias 245 may be formed in the laminate core 235, and may electrically couple the first and second interposer metal planes 242, 244. As such, the first and second interposer metal planes 242, 244 may be electrically coupled through the interposer vias 245.

While FIG. 2 illustrates one set of interposer vias, this is merely an example. In general, there can be K sets of interposer vias (same as the number of laminate cores), in which each set may comprise one or more vias. Each set of one or more interposer vias may be formed in the corresponding laminate core, and may electrically connect the adjacent interposer metal planes. As such, the first and second interposer metal planes 242, 244 may be electrically coupled through the K sets of interposer vias and the J intermediate interposer metal planes.

Thus, in this particular instance of FIG. 2, the lower substrate 210 may comprise, from top to bottom, the first lower SR 212 on and below the mold 260, the first lower metal plane 222 below and in contact with the first lower SR 212, the first lower dielectric 215 below and in contact with the first lower metal plane 222, a second lower metal plane 224 below the first lower dielectric 215, and one or more first lower vias 225 formed in the first lower dielectric 215. Note that portions of portions of the first lower metal plane 222 may also be below and in contact with die bumps 255 of the die 250. Also note that, the one or more first lower vias 225 may electrically connect the first and second lower metal planes 222, 224.

The lower substrate 210 may further comprise the intermediate lower metal plane 226 between the first and second lower metal planes 222, 224, the first lower dielectric 215 in between the first lower metal plane 222 and the intermediate lower metal plane 226, the second lower dielectric 217 between the intermediate lower metal plane 226 and the second lower metal plane 224, one or more second lower vias 227 formed in the second lower dielectric 217. The first and second lower metal planes 222, 224 may be electrically coupled with each other through the one or more first lower vias 225, the intermediate lower metal plane 226, and the one or more second lower vias 217.

Interposer balls 275 may be formed in the mold 260 in between the interposer 230 and the lower substrate 210 and may be in electrical contact with the first interposer metal plane 242 (of the interposer 230) and the first lower metal plane 222 (of the lower substrate 210). That is, the interposer balls 275 may provide signal connections between the interposer 230 and the lower substrate 210. BGA balls 270 may be formed on and below the lower substrate 210 and may be in electrical contact with the second lower metal plane 224. The die 250 comprises die bumps 255 that are in contact with first lower metal plane 222. In this way, the die 250—which may be a system-on-chip (SoC) die in an aspect—can be electrically coupled to the BGA balls 270.

Thus, in this particular instance of FIG. 2, from bottom to top, the interposer 230 may comprise the first interposer SR 232, the first interposer metal plane 242 on the first interposer SR 232, the laminate core 235 on the first interposer metal plane 242, the second interposer metal plane 244 on the laminate core 235, the second first interposer SR 234 on the second interposer metal plane 244, and one or more interposer vias 245 formed in the laminate core 235.

Also, the second interposer metal plane 244 and the BGA balls 270 may be electrically coupled with each other through the interposer metal planes and interposer vias of the interposer 230 (e.g., the second interposer metal plane 244, the interposer vias 245, and the first interposer metal plane 242), the interposer balls 275, and the lower metal planes and lower vias of the lower substrate 210 (e.g., the first lower metal plane 222, the first lower vias 225, the intermediate lower metal plane 226, the second lower vias 227, and the second lower metal plane 224).

Recall from above that it is proposed to enhance the contact area between the mold 260 and the interposer 230 to minimize or even eliminate delamination from occurring. Also recall that it is proposed to enhance the contact area between the mold 260 and interposer 230 by adding a vertical—i.e., Z-contact area component.

Figure 3A:
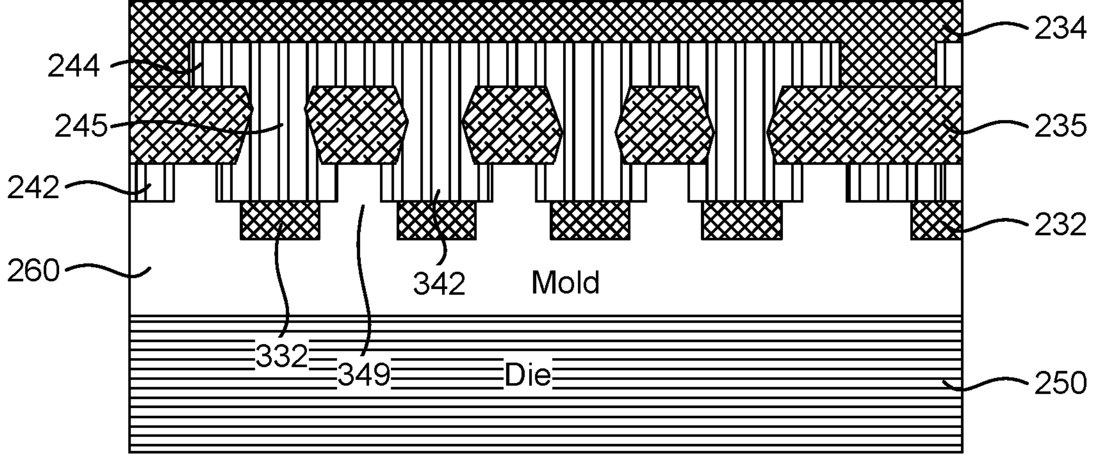
FIG. 3A illustrates a detailed view of a portion of the cross section of the device in accordance with one or more aspects of the disclosure.

This is shown in FIG. 3A which illustrates details of the dashed area of FIG. 2. In FIG. 3A, portions of the first interposer SR 232 above die 250 may be etched or otherwise processed to form one or more SR posts 332. Also, portions of the first interposer metal plane 242 may be etched or otherwise processed to form one or more post landings 342. The one or more SR posts 332 may be formed to be on and in contact with corresponding one or more post landings 342.

In doing so, one or more adhesion holes 349 may be created to expose the expose the side surfaces of one or more SR posts 332 and the side surfaces of the one or more post landings 342. The mold 260 may fill the one or more adhesion holes 349. As a result, the mold 260 may be contact with the exposed side surfaces of one or more SR posts 332 and of the one or more post landings 342. In this way, anchor effect may be provided by the vertical contact surfaces between the mold 260 and the SR posts 332 and the post landings 342, thus reducing the likelihood of delamination.

There are other technical advantages. For example, more volume of the mold 260 may be provided, which can better mitigate against warpage. As another example, the mold 260 may directly contact the first interposer metal plane 242 (e.g., through the post landings 342). This can enhance thermal characteristics.

In an aspect, the one or more adhesion holes 349 may also expose one or more portions of a lower surface of the laminate core 335. As a result, the mold 260 may also be in contact with the exposed one or more portions of the lower surface of the laminate core 335. In another aspect, the post landing 342 may be wider than corresponding SR post 332. That is, portions of lower surfaces of the post landings 342 may be exposed by an adhesion hole 349. As a result, the mold 260 may be in contact with the exposed lower surfaces of the post landings 342. Of course, the mold 260 may be in contact with the lower surfaces of the SR posts 332.

Figure 3B:
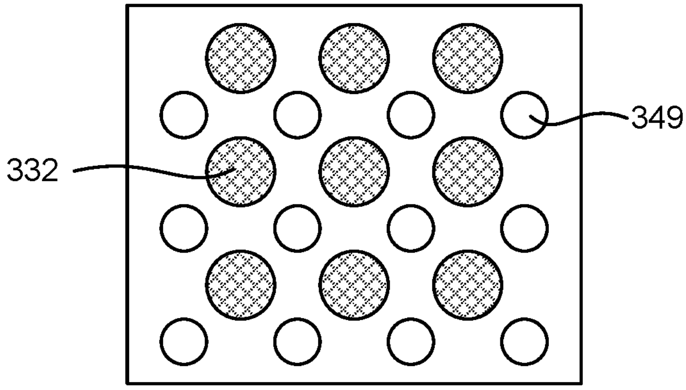
FIG. 3B illustrates a bottom view of an interface between mold and interposer in accordance with one or more aspects of the disclosure.

FIG. 3B illustrates an example of a bottom view of the interface between the mold 260 and interposer 230. In FIG. 3B, the SR posts 332 and the adhesion holes 349 are shown as being alternating. However, this is merely an example.

Figure 4A:
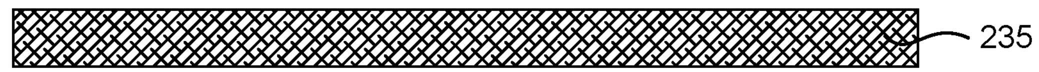
FIGS. 4A-4D illustrate examples of stages of fabricating an interposer in accordance with one or more aspects of the disclosure.

FIGS. 4A-4D illustrate examples of stages of fabricating the interposer 230. FIG. 4A illustrates a stage in which the laminate core 235 may be provided.

Figure 4B:

FIG. 4B illustrates a stage in which via holes may be formed in the laminate core 235.

Figure 4C:
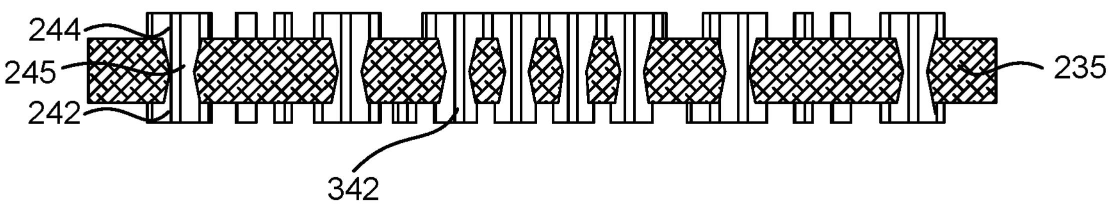

FIG. 4C illustrates a stage in which metal, such as copper, may be plated and patterned to form the first interposer metal plane 242, the one or more interposer vias 245, and the second interposer metal plane 244.

Figure 4D:
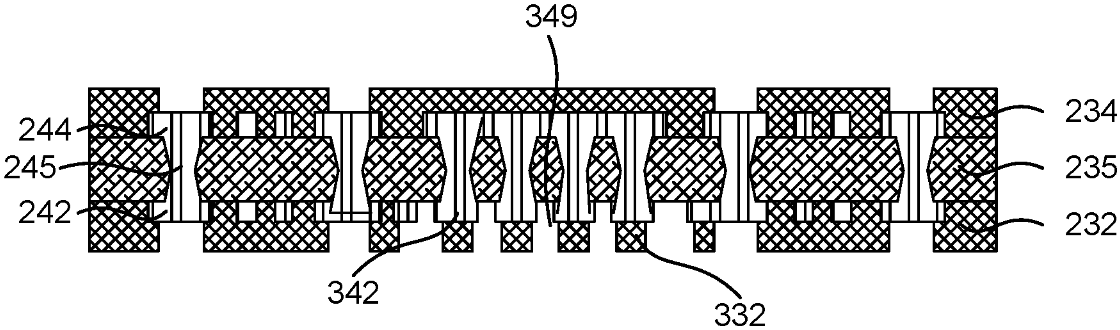

FIG. 4D illustrates a stage in which solder resist material may be deposited and developed to form the first interposer SR 232 and the second interposer SR 234. For example, the SR material may be laminated and exposed to a pattern.

FIG. 5 illustrates a flow chart of an example method 500 of fabricating a device, such as the device 200 in accordance with one or more aspects of the disclosure. In block 510, the die 250 may be provided.

In block 620, the interposer 230 may be formed above the die 250.

In block 530, the mold 260 may be formed in between the die 250 and the interposer 230. The mold 260 may encapsulating the upper and side surfaces of the die 250.

Recall that the interposer 230 may comprise the first interposer SR 232, the first interposer metal plane 242 on the first interposer SR 232, the laminate core 235 on the first interposer metal plane 242, the second interposer metal plane 244 on the laminate core 235, the second interposer SR 234 on the second interposer metal plane 244, and one or more interposer vias 245 formed in the laminate core 235.

Also recall that one or more adhesion holes 349 may expose side surfaces of the one or more SR posts 332 and of one or more post landings 342, in which one or more SR posts 332 may be portions of the first interposer SR 232 and the one or more post landings 342 may be portions of the first interposer metal plane 242. The one or more SR posts 332 may be formed on and in contact with corresponding one or more post landings 342.

Further recall that the mold 260 may fill the one or more adhesion holes 349 such that the mold 260 is in contact with the exposed side surfaces of one or more SR posts 332 and of the one or more post landings 342.

FIG. 6 is a flow chart of another example method 600 of fabricating a device, such as the device 200 in accordance with one or more aspects of the disclosure. In an aspect, the method 600 may be viewed as a more detailed version of the method 500 to fabricate a device.

Block 610 may be similar to block 510. That is in block 610, the die 250 may be provided.

Block 620 may be similar to block 520. That is in block 620, the interposer 230 may be formed above the die 250.

Block 630 may be similar to block 530. That is in block 630, the mold 260 may be formed in between the die 250 and the interposer 230. The mold 260 may encapsulating the upper and side surfaces of the die 250.

In block 640, the lower substrate 210 may be formed below the mold 260 and the die 250.

In block 650, one or more interposer balls 275 may be formed in the mold 260 between the interposer 230 and the lower substrate 210. The one or more interposer balls 275 may provide signal connections between the interposer 230 and the lower substrate 210.

Figure 7:
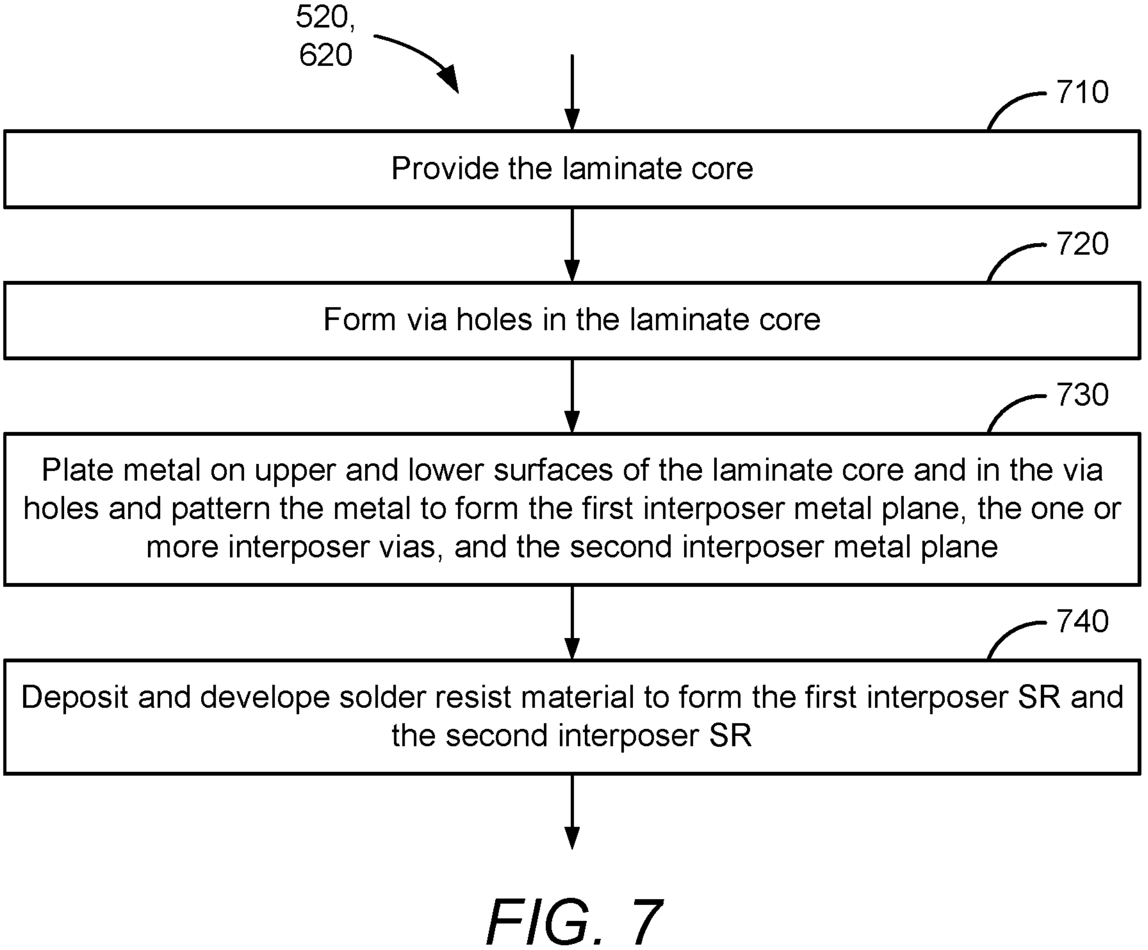

FIG. 7 illustrates a flow chart of a process to implement blocks 520, 620 of forming the interposer 230 in accordance with one or more aspects. In block 710, the laminate core 235 may be provided. Block 710 may correspond to the fabrication stage illustrated in FIG. 4A.

In block 720, via holes may be formed in the laminate core 235. Block 720 may correspond to the fabrication stage illustrated in FIG. 4B.

In block 730, metal may be plated and patterned to form the first interposer metal plane 242, the one or more interposer vias 245, and the second interposer metal plane 244. Block 730 may correspond to the fabrication stage illustrated in FIG. 4C.

In block 740, resist material may be deposited and developed to form the first interposer SR 232 and the second interposer SR 234. Block 740 may correspond to the fabrication stage illustrated in FIG. 4D.

Figure 8:
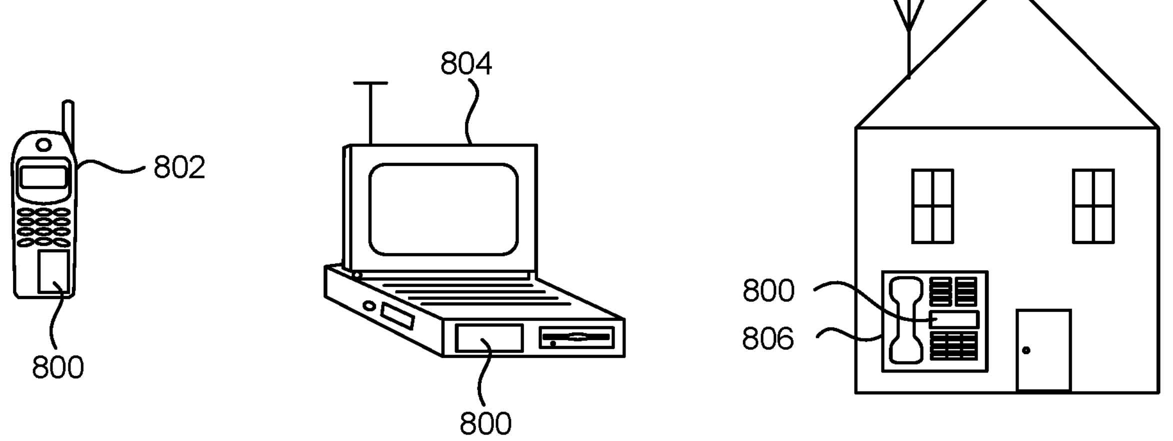
FIG. 8 illustrates various electronic devices which may utilize one or more aspects of the disclosure.

FIG. 8 illustrates various electronic devices 800 that may be integrated with any of the aforementioned devices in accordance with various aspects of the disclosure. For example, a mobile phone device 802, a laptop computer device 804, and a fixed location terminal device 806 may each be considered generally user equipment (UE) and may include one or more devices (e.g., devices 200) as described herein. The devices 802, 804, 806 illustrated in FIG. 8 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A device comprising: a die; an interposer above the die; and a mold in between the die and the interposer, the mold encapsulating upper and side surfaces of the die, wherein the interposer comprises: a first interposer solder resist (SR); a first interposer metal plane on the first interposer SR; a laminate core on the first interposer metal plane; a second interposer metal plane on the laminate core; a second first interposer SR on the second interposer metal plane; and one or more interposer vias formed in the laminate core, the one or more interposer vias electrically coupling the first and second interposer metal planes; wherein the device further comprises one or more adhesion holes exposing side surfaces of one or more SR posts and one or more post landings, the one or more SR posts being portions of the first interposer SR and the one or more post landings being portions of the first interposer metal plane, the one or more SR posts being formed on and in contact with corresponding one or more post landings, and wherein the mold fills the one or more adhesion holes such that the mold is in contact with the exposed side surfaces of one or more SR posts and of the one or more post landings.

Clause 2: The device of clause 1, wherein the one or more adhesion holes also expose one or more portions of a lower surface of the laminate core such that the mold is in contact with the exposed one or more portions of the lower surface of the laminate core.

Clause 3: The device of any of clauses 1-2, wherein at least one post landing is wider than a corresponding at least one SR post such that at least a portion of a lower surface of the at least one post landing is exposed by an adhesion hole, and wherein the mold is in contact with the exposed lower surface of the at least one post landing.

Clause 4: The device of any of clauses 1-3, wherein the mold is in contact with lower surfaces of the one or more SR posts.

Clause 5: The device of any of clauses 1-4, further comprising: a lower substrate below the mold and the die; and one or more interposer balls formed in the mold between the interposer and the lower substrate, the one or more interposer balls providing signal connections between the interposer and the lower substrate.

Clause 6: The device of clause 5, wherein the lower substrate comprises: a first lower SR on and below the mold; a first lower metal plane below and in contact with the first lower SR, portions of the first lower metal plane also being below and in contact with die bumps of the die; a first lower dielectric below and in contact with the first lower metal plane; a second lower metal plane below the first lower dielectric; and one or more first lower vias formed in the first lower dielectric, the one or more first lower vias electrically connecting the first and second lower metal planes.

Clause 7: The device of clause 6, wherein the lower substrate further comprises: an intermediate lower metal plane between the first and second lower metal planes, the first lower dielectric being between the first lower metal plane and the intermediate lower metal plane; a second lower dielectric between the intermediate lower metal plane and the second lower metal plane; and one or more second lower vias formed in the second lower dielectric, wherein the first and second lower metal planes are electrically coupled with each other through the one or more first lower vias, the intermediate lower metal plane, and the one or more second lower vias.

Clause 8: The device of any of clauses 1-7, wherein the first interposer metal plane and the second interposer metal plane are formed from copper.

Clause 9: The device of any of clauses 1-8, wherein the laminate core is a copper clad laminate (CCL).

Clause 10: The device of any of clauses 1-9, wherein the device is a package-on-package (POP) device.

Clause 11: The device of any of clauses 1-10, wherein the die is a system-on-chip (SoC) die.

Clause 12: The device of any of clauses 1-11, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 13: A method of fabricating a device, the method comprising: providing a die; forming an interposer above the die; and forming a mold in between the die and the interposer, the mold encapsulating upper and side surfaces of the die, wherein the interposer comprises: a first interposer solder resist (SR); a first interposer metal plane on the first interposer SR; a laminate core on the first interposer metal plane; a second interposer metal plane on the laminate core; a second first interposer SR on the second interposer metal plane; and one or more interposer vias formed in the laminate core, the one or more interposer vias electrically coupling the first and second interposer metal planes; wherein the device further comprises one or more adhesion holes exposing side surfaces of one or more SR posts and one or more post landings, the one or more SR posts being portions of the first interposer SR and the one or more post landings being portions of the first interposer metal plane, the one or more SR posts being formed on and in contact with corresponding one or more post landings, and wherein the mold fills the one or more adhesion holes such that the mold is in contact with the exposed side surfaces of one or more SR posts and of the one or more post landings.

Clause 14: The method of clause 13, wherein the one or more adhesion holes also expose one or more portions of a lower surface of the laminate core such that the mold is in contact with the exposed one or more portions of the lower surface of the laminate core.

Clause 15: The method of any of clauses 13-14, wherein at least one post landing is wider than a corresponding at least one SR post such that at least a portion of a lower surface of the at least one post landing is exposed by an adhesion hole, and wherein the mold is in contact with the exposed lower surface of the at least one post landing.

Clause 16: The method of any of clauses 13-15, wherein the mold is in contact with lower surfaces of the one or more SR posts.

Clause 17: The method of any of clauses 13-16, further comprising: forming a lower substrate below the mold and the die; and forming one or more interposer balls formed in the mold between the interposer and the lower substrate, the one or more interposer balls providing signal connections between the interposer and the lower substrate.

Clause 18: The method of clause 17, wherein the lower substrate comprises: a first lower SR on and below the mold; a first lower metal plane below and in contact with the first lower SR, portions of the first lower metal plane also being below and in contact with die bumps of the die; a first lower dielectric below and in contact with the first lower metal plane; a second lower metal plane below the first lower dielectric; and one or more first lower vias formed in the first lower dielectric, the one or more first lower vias electrically connecting the first and second lower metal planes.

Clause 19: The method of clause 18, wherein the lower substrate further comprises: an intermediate lower metal plane between the first and second lower metal planes, the first lower dielectric being between the first lower metal plane and the intermediate lower metal plane; a second lower dielectric between the intermediate lower metal plane and the second lower metal plane; and one or more second lower vias formed in the second lower dielectric, wherein the first and second lower metal planes are electrically coupled with each other through the one or more first lower vias, the intermediate lower metal plane, and the one or more second lower vias.

Clause 20: The method of any of clauses 13-19, wherein the first interposer metal plane and the second interposer metal plane are formed from copper.

Clause 21: The method of any of clauses 13-20, wherein the laminate core is a copper clad laminate (CCL).

Clause 22: The method of any of clauses 13-21, wherein the device is a package-on-package (POP) device.

Clause 23: The method of any of clauses 13-22, wherein the die is a system-on-chip (SoC) die.

Clause 24: The method of any of clauses 13-23, wherein forming the interposer comprises: providing the laminate core; forming via holes in the laminate core; plating metal on upper and lower surfaces of the laminate core and in the via holes and patterning the metal to form the first interposer metal plane, the one or more interposer vias, and the second interposer metal plane; and depositing and developing solder resist material to form the first interposer SR and the second interposer SR.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth® (BT), Bluetooth® Low Energy (BLE), IEEE 802.11 (Wi-Fi®), and IEEE 802.15.4 (Zigbee/Thread) or other protocols that may be used in a wireless communications network or a data communications network. Bluetooth® Low Energy (also known as Bluetooth® LE, BLE, and Bluetooth® Smart) is a wireless personal area network technology designed and marketed by the Bluetooth® Special Interest Group intended to provide considerably reduced power consumption and cost while maintaining a similar communication range. BLE was merged into the main Bluetooth® standard in 2010 with the adoption of the Bluetooth® Core Specification Version 4.0 and updated in Bluetooth® 5.

The word "exemplary" is used herein to mean "serving as an example, instance, or illustration." Any details described herein as “exemplary” is not to be construed as advantageous over other examples. Likewise, the term “examples” does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms “connected,” “coupled,” or any variant thereof, mean any connection or coupling, either direct or indirect, between elements, and can encompass a presence of an intermediate element between two elements that are “connected” or “coupled” together via the intermediate element unless the connection is expressly disclosed as being directly connected.

Any reference herein to an element using a designation such as “first,” “second,” and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device, comprising:
- a die;
- an interposer above the die; and
- a mold in between the die and the interposer, the mold encapsulating upper and side surfaces of the die,
- wherein the interposer comprises:
  - a first interposer solder resist (SR);
  - a first interposer metal plane on the first interposer SR;
  - a laminate core on the first interposer metal plane;
  - a second interposer metal plane on the laminate core;
  - a second first interposer SR on the second interposer metal plane; and
  - one or more interposer vias formed in the laminate core, the one or more interposer vias electrically coupling the first and second interposer metal planes;
- wherein the device further comprises one or more adhesion holes exposing side surfaces of one or more SR posts and one or more post landings, the one or more SR posts being portions of the first interposer SR and the one or more post landings being portions of the first interposer metal plane, the one or more SR posts being formed on and in contact with corresponding one or more post landings,
- wherein the mold fills the one or more adhesion holes such that the mold is in contact with the exposed side surfaces of one or more SR posts and of the one or more post landings, and
- wherein the mold is in contact with lower surfaces of the one or more SR posts.

2. The device of claim 1, wherein the one or more adhesion holes also expose one or more portions of a lower surface of the laminate core such that the mold is in contact with the exposed one or more portions of the lower surface of the laminate core.

3. The device of claim 1,
- wherein at least one post landing is wider than a corresponding at least one SR post such that at least a portion of a lower surface of the at least one post landing is exposed by an adhesion hole, and
- wherein the mold is in contact with the exposed lower surface of the at least one post landing.

4. The device of claim 1, further comprising:
- a lower substrate below the mold and the die; and
- one or more interposer balls formed in the mold between the interposer and the lower substrate, the one or more interposer balls providing signal connections between the interposer and the lower substrate.

5. The device of claim 4, wherein the lower substrate comprises:
- a first lower SR on and below the mold;

a first lower metal plane below and in contact with the first lower SR, portions of the first lower metal plane also being below and in contact with die bumps of the die;

a first lower dielectric below and in contact with the first lower metal plane;

a second lower metal plane below the first lower dielectric; and one or more first lower vias formed in the first lower dielectric, the one or more first lower vias electrically connecting the first and second lower metal planes.

6. The device of claim 5, wherein the lower substrate further comprises:

an intermediate lower metal plane between the first and second lower metal planes, the first lower dielectric being between the first lower metal plane and the intermediate lower metal plane;

a second lower dielectric between the intermediate lower metal plane and the second lower metal plane; and one or more second lower vias formed in the second lower dielectric, wherein the first and second lower metal planes are electrically coupled with each other through the one or more first lower vias, the intermediate lower metal plane, and the one or more second lower vias.

7. The device of claim 1, wherein the first interposer metal plane and the second interposer metal plane are formed from copper.

8. The device of claim 1, wherein the laminate core is a copper clad laminate (CCL).

9. The device of claim 1, wherein the device is a package-on-package (POP) device.

10. The device of claim 1, wherein the die is a system-on-chip (SoC) die.

11. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IT) device, a laptop computer, a server, and a device in an automotive vehicle.

12. A method of fabricating a device, the method comprising:

providing a die;

forming an interposer above the die; and forming a mold in between the die and the interposer, the mold encapsulating upper and side surfaces of the die, wherein the interposer comprises:

a first interposer solder resist (SR);

a first interposer metal plane on the first interposer SR;

a laminate core on the first interposer metal plane;

a second interposer metal plane on the laminate core;

a second first interposer SR on the second interposer metal plane; and one or more interposer vias formed in the laminate core, the one or more interposer vias electrically coupling the first and second interposer metal planes;

wherein the device further comprises one or more adhesion holes exposing side surfaces of one or more SR posts and one or more post landings, the one or more SR posts being portions of the first interposer SR and the one or more post landings being portions of the first interposer metal plane, the one or more SR posts being formed on and in contact with corresponding one or more post landings, wherein the mold fills the one or more adhesion holes such that the mold is in contact with the exposed side surfaces of one or more SR posts and of the one or more post landings, and wherein the mold is in contact with lower surfaces of the one or more SR posts.

13. The method of claim 12, wherein the one or more adhesion holes also expose one or more portions of a lower surface of the laminate core such that the mold is in contact with the exposed one or more portions of the lower surface of the laminate core.

14. The method of claim 12, wherein at least one post landing is wider than a corresponding at least one SR post such that at least a portion of a lower surface of the at least one post landing is exposed by an adhesion hole, and wherein the mold is in contact with the exposed lower surface of the at least one post landing.

15. The method of claim 12, further comprising:

forming a lower substrate below the mold and the die; and forming one or more interposer balls formed in the mold between the interposer and the lower substrate, the one or more interposer balls providing signal connections between the interposer and the lower substrate.

16. The method of claim 15, wherein the lower substrate comprises:

a first lower SR on and below the mold;

a first lower metal plane below and in contact with the first lower SR, portions of the first lower metal plane also being below and in contact with die bumps of the die;

a first lower dielectric below and in contact with the first lower metal plane;

a second lower metal plane below the first lower dielectric; and one or more first lower vias formed in the first lower dielectric, the one or more first lower vias electrically connecting the first and second lower metal planes.

17. The method of claim 16, wherein the lower substrate further comprises:

an intermediate lower metal plane between the first and second lower metal planes, the first lower dielectric being between the first lower metal plane and the intermediate lower metal plane;

a second lower dielectric between the intermediate lower metal plane and the second lower metal plane; and one or more second lower vias formed in the second lower dielectric, wherein the first and second lower metal planes are electrically coupled with each other through the one or more first lower vias, the intermediate lower metal plane, and the one or more second lower vias.

18. The method of claim 12, wherein the first interposer metal plane and the second interposer metal plane are formed from copper.

19. The method of claim 12, wherein the laminate core is a copper clad laminate (CCL).

20. The method of claim 12, wherein the device is a package-on-package (POP) device.

21. The method of claim 12, wherein the die is a system-on-chip (SoC) die.

22. The method of claim 12, wherein forming the interposer comprises:

providing the laminate core;

forming via holes in the laminate core;

plating metal on upper and lower surfaces of the laminate core and in the via holes and patterning the metal to form the first interposer metal plane, the one or more interposer vias, and the second interposer metal plane; and depositing and developing solder resist material to form the first interposer SR and the second interposer SR.

* * * * *